(12) United States Patent
Kim

(10) Patent No.: US 7,495,959 B2
(45) Date of Patent: Feb. 24, 2009

(54) NONVOLATILE MEMORY DEVICE AND METHOD OF READING INFORMATION FROM THE SAME

(75) Inventor: Ho-jung Kim, Suwon-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 90 days.

(21) Appl. No.: 11/605,225

(22) Filed: Nov. 29, 2006

(65) Prior Publication Data

US 2008/0101128 A1    May 1, 2008

(30) Foreign Application Priority Data

Oct. 31, 2006   (KR)   .................... 10-2006-0106715

(51) Int. Cl.
  *G11C 16/04*   (2006.01)
(52) U.S. Cl. ..................... 365/185.17; 365/185.16; 365/185.18
(58) Field of Classification Search ............. 365/185.17
   See application file for complete search history.

(56) References Cited

U.S. PATENT DOCUMENTS

| | | | | |
|---|---|---|---|---|
| 5,696,717 A * | 12/1997 | Koh | ..................... | 365/185.22 |
| 5,963,475 A * | 10/1999 | Choi et al. | ............. | 365/185.11 |
| 6,125,052 A * | 9/2000 | Tanaka | ................... | 365/185.03 |
| 6,236,594 B1 | 5/2001 | Kwon | | |
| 6,337,807 B2 | 1/2002 | Futatsuyama et al. | | |
| 6,370,062 B2 | 4/2002 | Choi | | |
| 6,487,117 B1 * | 11/2002 | Choi et al. | ............. | 365/185.17 |
| 6,621,735 B2 | 9/2003 | Nakamura et al. | | |
| 6,661,707 B2 * | 12/2003 | Choi et al. | ............. | 365/185.17 |
| 7,061,802 B2 * | 6/2006 | Nakai | ..................... | 365/185.13 |
| 7,212,447 B2 * | 5/2007 | Aritome | ................ | 365/185.25 |
| 7,233,522 B2 * | 6/2007 | Chen et al. | ............. | 365/185.02 |
| 7,274,603 B2 | 9/2007 | Futatsuyama et al. | | |
| 7,315,472 B2 * | 1/2008 | Lee | ........................ | 365/185.17 |
| 2004/0151033 A1 * | 8/2004 | Takazawa et al. | ...... | 365/189.09 |
| 2004/0213045 A1 * | 10/2004 | Nakai | ..................... | 365/185.13 |
| 2005/0213378 A1 * | 9/2005 | Chang | ................... | 365/185.03 |

FOREIGN PATENT DOCUMENTS

| | | |
|---|---|---|
| JP | 11-086574 | 3/1999 |
| JP | 2002-150782 | 5/2002 |
| JP | 2002-358792 | 12/2002 |
| KR | 1020020047770 A | 6/2002 |
| KR | 1020020050367 A | 6/2002 |
| KR | 1020050002245 A | 1/2005 |

* cited by examiner

*Primary Examiner*—Son L Mai
(74) *Attorney, Agent, or Firm*—Volentine & Whitt, PLLC

(57) ABSTRACT

A nonvolatile memory device includes a memory cell array and a voltage controller. The memory cell array includes a plurality of memory blocks each including a plurality of cell strings, where each of the cell strings includes a first selection transistor, a second selection transistor, and at least one memory cell transistor connected in series between the first and second selection transistors. The voltage controller applies a first selection voltage to first selection lines connected to the first selection transistors, a second selection voltage to second selection lines connected to the second selection transistors, and a word line voltage to word lines connected to the memory cell transistors, in response to a plurality of block selection signals corresponding to the memory blocks. The voltage controller precharges the second selection lines to a precharge voltage by applying the second selection line voltage to the second selection lines in a standby state, where the second selection line voltage is equal to the precharge voltage.

20 Claims, 5 Drawing Sheets

US 7,495,959 B2

NONVOLATILE MEMORY DEVICE AND METHOD OF READING INFORMATION FROM THE SAME

BACKGROUND OF THE INVENTION

1. Field of the Invention

The present invention relates to nonvolatile memory devices, and more particularly, the present invention relates to a voltage controller of a nonvolatile memory device and a method of reading a non-volatile memory device.

A claim of priority is made to Korean Patent Application No. 10-2006-0106715, filed Oct. 31, 2006, in the Korean Intellectual Property Office, the disclosure of which is incorporated herein by reference in its entirety.

2. Description of the Related Art

F-N tunneling is utilized to program and erase cell transistors contained in non-volatile memory devices, such as NAND type flash memory devices.

For example, F-N tunneling is induced in an erase operation by applying a low voltage (e.g., 0V or ground) to a control gate of a cell transistor, and by applying a high voltage (e.g., 20V) which exceeds a supply voltage to a semiconductor substrate (or bulk) containing the cell transistor. The resultant large voltage differential causes a strong electric field to be formed between the floating gate and the bulk, and F-N tunneling occurs in which electrons are discharged from the floating gate to the bulk. This causes the threshold voltage (Vth) of the erased cell transistor to shift in a negative direction (e.g., Vth≦−3V). In conventional terms, the erased state is designated as data "1", and a cell transistor in this state is referred to as an "ON" cell.

In a program operation, for example, a high voltage (e.g., 18V) which exceeds a supply voltage is applied to the control gate of the cell transistor, and a low voltage (e.g., 0V or ground) is applied to the drain of the cell transistor and to the semiconductor bulk. When the cell transistor is biased in this manner, F-N tunneling results and electrons are injected to a floating gate of the cell transistor. This causes the threshold voltage (Vth) of the programmed cell transistor to shift in a positive direction (e.g., Vth≧+1V). The programmed state is conventionally designated as data "0", and the cell transistor is referred to as an "OFF" cell.

FIG. 1 is a block diagram of a conventional NAND type flash memory device 100. The NAND type flash memory device 100 includes a memory cell array 110, a row selecting circuit 130, a row decoder circuit (not shown), a page buffer circuit 150 (or a data sensing and latching circuit), and a column decoder circuit 170.

The memory cell array 110 includes a plurality of memory blocks BLK0 through BLKn each having a plurality of cell strings (n is a positive integer). As illustrated in FIG. 1, each of the cell strings includes of a string selection transistor SST connected to a corresponding bit line, e.g., a bit line BL0, a ground selection transistor GST connected to a common source line CSL, and memory cell transistors MC15 through MC0 connected between the string selection transistor SST and the ground selection transistor GST. Each of the memory cell transistors MC15 through MC0 forms a memory cell. FIG. 1 illustrates the example of 16 memory cells per cell string, but the number of memory cells contained in each string may vary among different NAND flash memory devices.

As shown in FIG. 1, the string selection transistor SST, the memory cells MC15 through MC0, and the ground selection transistor GST are respectively gated to a string selection line SSL, word lines WL15 through WL0, and a ground selection line GSL. Further, as shown, block selection transistors BS17 through BS0 are respectively connected between the lines SSL, WL15 through WL0, and GSL, and lines SS, Si15 through Si0, and GS. The block selection transistors BS17 through BS0 are commonly controlled by a block selection signal BS.

The row selecting circuit 130 is responsive to the row decoder (not shown) to select a word line (or a page) from among the word lines WL0 through WL15 via block selection transistors BS0 through BS17. In a programming mode, the page buffer circuit 150 temporarily stores data to be stored in memory cells of the selected word line (or page). In a read mode, the page buffer circuit 150 senses data stored in the memory cells of the selected word line (or page). The page buffer circuit 150 includes a plurality of page buffers (or data sensing and latching blocks) which respectively correspond to rows (bit lines) related to the selected page. Data bits that are sensed (read) from the memory cells of the selected page are output via the column decoder circuit 170 in predetermined units, e.g., in units of bytes X8.

The conventional NAND-type flash memory device described above requires substantial time to execute a read operation. This is because read operations are performed in units of memory blocks (and not in units of memory cells), and read data must typically be fetched from the flash memory and loaded into main memory (e.g., DRAM) prior to execution by a processor. In an effort to overcome this drawback, a type of flash memory device having an execute-in-place (XIP) structure has been introduced.

FIG. 2 is a circuit diagram for explaining a read operation of one type of flash memory device 200 having an XIP structure. As shown, a single memory cell transistor is connected in each cell string, thus allowing processor access to the stored data at relatively high speeds. Also, wirings for providing voltages to the string selection lines SSL are metal-strapped to one another, as are the wirings for providing voltages to the ground selection lines GSL.

Further, the string selection lines SSL are directly connected to the row selecting circuit. In a standby state prior to the read operation, both the string selection lines SSL and the ground selection lines GSL are discharged to ground voltage. When the read operation is performed, a supply voltage (e.g., VPP) is applied as a block selection signal to the selection transistors of a selected block, while a ground voltage (e.g., 0V) is applied as a block selection signal to the selection transistors of a non-selected block During the read operation, the voltages of the string selection line SSL and the ground selection line GSL of the selected block are increased from the ground voltage (0V) to a read voltage VREAD. Further, the ground voltage (0V) is applied to the word line WL of the selected block. In this state, data is read out from the cell transistor(s) of a selected bit line(s).

In the configuration described above, coupling noise may be generated in the word line WL of the selected block during the read operation, since the word line WL is influenced by coupling between the string selection line SSL and the ground selection line GSL. This can inhibit accurate execution of the read operation.

SUMMARY OF THE INVENTION

According to an aspect of the present invention, a nonvolatile memory device is provided which includes a memory cell array and a voltage controller. The memory cell array includes a plurality of memory blocks each including a plurality of cell strings, where each of the cell strings includes a first selection transistor, a second selection transistor, and at least one memory cell transistor connected in series between the first and second selection transistors. The voltage controller applies a first selection voltage to first selection lines connected to the first selection transistors, a second selection voltage to second selection lines connected to the second selection transistors, and a word line voltage to word lines connected to the memory cell transistors, in response to a plurality of block selection signals corresponding to the memory blocks. The voltage controller precharges the second selection lines to a precharge voltage by applying the second selection line voltage to the second selection lines in a standby state, where the second selection line voltage is equal to the precharge voltage.

According to another aspect of the present invention, a reading method of a nonvolatile memory device is provided. The nonvolatile memory device includes a plurality of memory blocks each having a plurality of cell strings, where each of the cell strings includes a first selection transistor, a second selection transistor, and at least one memory cell transistor connected in series between the first and second selection transistors. The method includes precharging a second selection line, which is connected to the second selection transistor, to a precharge voltage, and performing a read operation on a memory block selected from among the memory blocks, in response to a read command and an address command.

BRIEF DESCRIPTION OF THE DRAWINGS

The above and other aspects and advantages of the present invention will become readily apparent from the detailed description that follows, with reference to the accompanying drawings, in which.

DETAILED DESCRIPTION OF EMBODIMENTS

Figure 1:
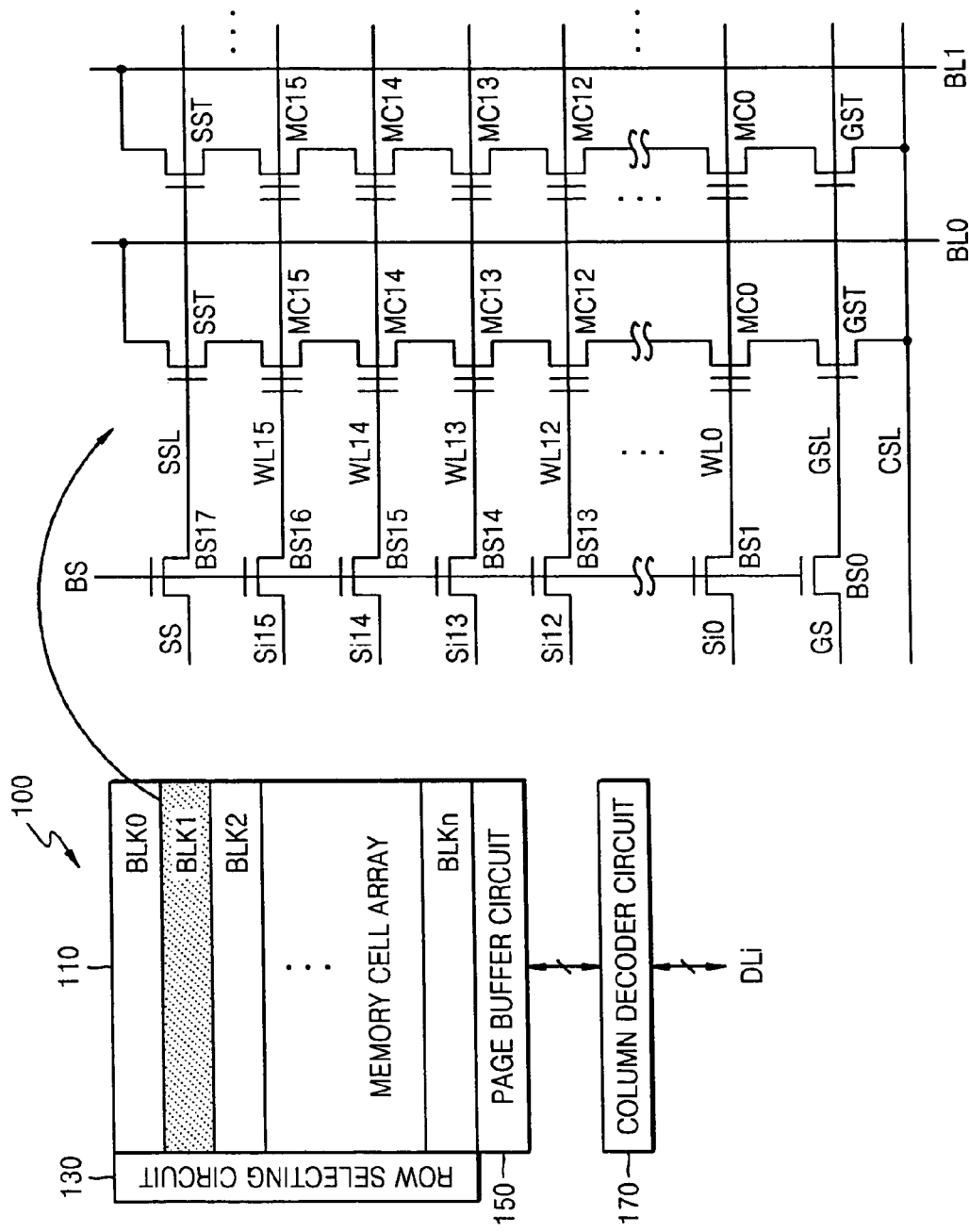
FIG. 1 is a block diagram of a conventional NAND type flash memory device.

Hereinafter, exemplary and non-limiting embodiments of the present invention will be described in detail with reference to the accompanying drawings. Like reference numerals denote like elements throughout the specification.

Figure 3:
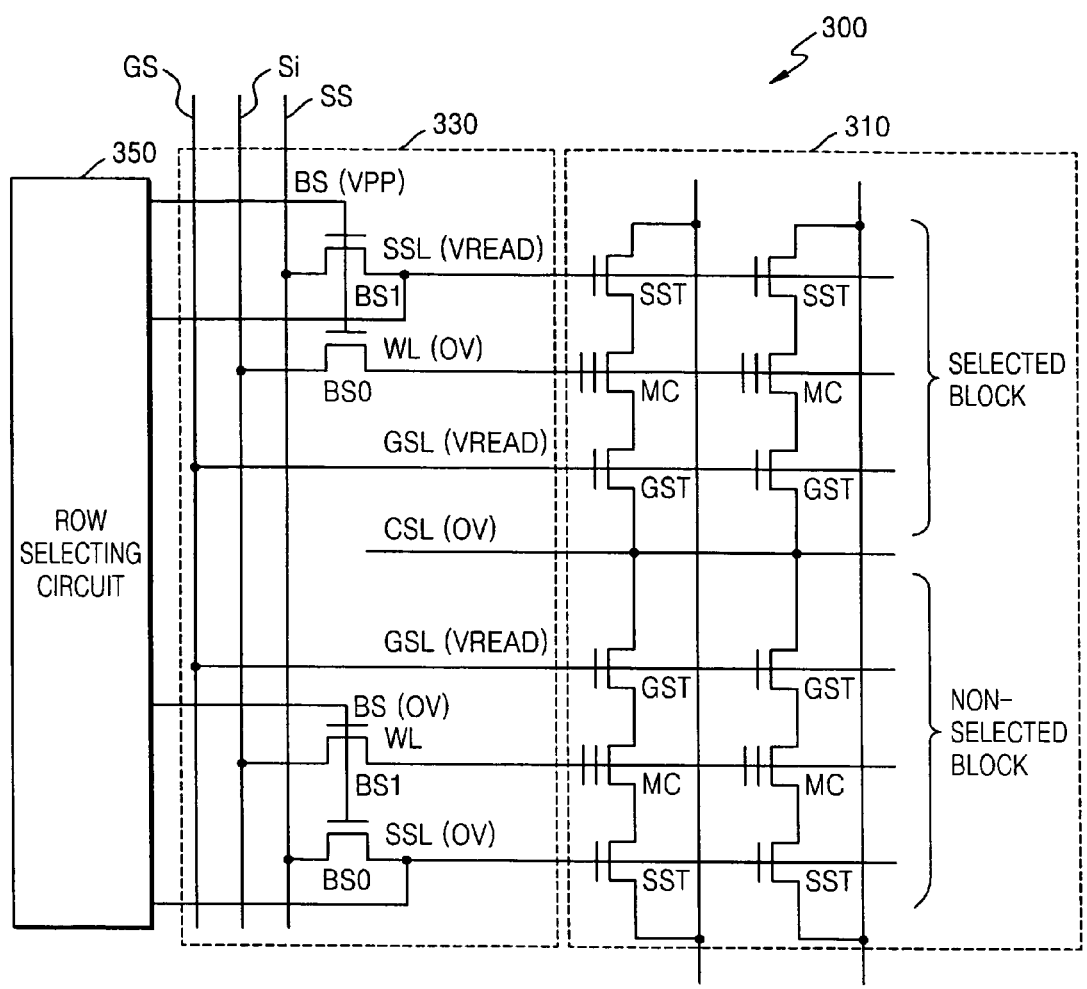
FIG. 3 is a block diagram of a nonvolatile memory device according to an embodiment of the present invention.

FIG. 3 is a block diagram of a portion of a nonvolatile memory device 300 according to an embodiment of the present invention. In particular, FIG. 3 is for describing a read operation of the nonvolatile memory device 300. As shown, the nonvolatile memory device 300 includes a memory cell array 310 and a voltage controller 330, and may further include a row selecting circuit 350.

The memory cell array 310 may include one or multiple memory blocks each including of a plurality of cell strings. By way of example only, and to simplify the drawing, FIG. 3 illustrates two memory blocks, and two cell strings within each memory block. The memory blocks of the memory cell array 310 are referred to herein as a selected block in which a memory cell is to be read, and a non-selected block in which a memory cell is not to be read.

Each of the cell strings includes a first selection transistor, a second selection transistor, and at least one memory cell transistor MC connected in series between the first and second selection transistors. Each memory cell string is connected between a bit line of the memory cell array 310 and a column selection line CSL. As shown in the example of FIG. 3, a cell string of the selected memory block and a cell string of the non-selected memory block are connected to the same bit line.

In the example of FIG. 3, and in the description that follows, the first selection transistor is a string selection transistor SST that is gated to a string selection line SSL, and the second selection transistor is a ground selection transistor GST that is gated to a ground selection line GSL.

Also, the example of FIG. 3 illustrates the case where each cell string includes a single memory cell transistor and is configured in an XIP structure. The invention is not limited in this respect, and, for example, multiple memory cell transistors may be provided in each cell string.

The voltage controller 330 includes block selection transistors BS0 and BS1 for each of the memory blocks of the memory cell array 310. The block selection transistors BS0 and BS1 are gated to respective block selection signals BS. In operation (e.g., programming, read and erase operations), the block selection transistors BS1 are responsive to respective block selection signals BS to apply a string selection voltage SS to string selection lines SSL of the memory cell array 310, and the block selection transistors BS0 are responsive to the respective block selection signals to apply a word line voltage Si to word lines WL of the memory cell array 310. For example, the block selection signal BS of the selected memory block may be a high voltage such as VPP, and the block selection signal BS of each non-selected memory block may be a low voltage such as ground (0V).

Figure 2:
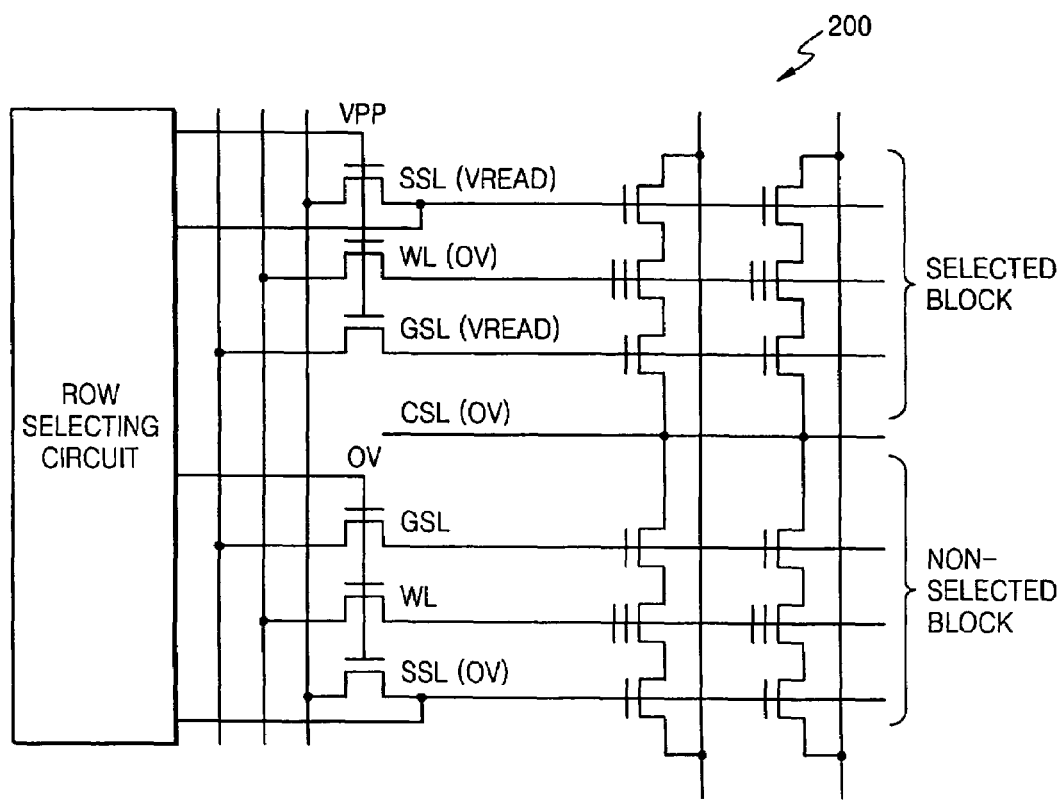
FIG. 2 is a block diagram for explaining a read operation of a conventional flash memory device having an execute-in-place (XIP) structure.

As shown in FIG. 3, and in contrast with FIG. 2, voltage controller 300 is not equipped with a block selection transistor for the ground selection line GSL of each memory block. In other words, the ground selection lines GSL of the memory blocks are directly applied with a ground selection voltage GS independently of the logic state of the respective block selection signals BS. This aspect of the embodiment will be described in greater detail later herein.

The nonvolatile memory device 300 may further include a row selecting circuit 350 which is utilized, for example, to apply the block selections signals BS and to pre-charge the string selection lines SSL. For example, the row selecting circuit 350 may output the respective block signals BS in response to an address command that is input when a predetermined operation is executed.

In FIG. 3, the row selecting circuit 350 and the voltage controller 330 are illustrated as separate circuit blocks. However, this is for descriptive purposes only. It should be apparent to those of ordinary skill in the technical field to which the present embodiment pertains that the row selecting circuit 350 and the voltage controller 330 may be integrated into a single circuit block, such as a row decoder block.

The present embodiment is partially characterized by the second selection line voltage (e.g., the ground selection voltage GS) being applied directly to the second selection lines (e.g., the ground selection lines GSL). For example, the common voltage line carrying the ground selection voltage GS for the plural memory blocks of the memory array 310 is directly electrically connected to the grounds selection lines GSL of the plural memory blocks. In other words, a block selection transistor BS is not interposed between the common voltage line carrying the grounds selection voltage GS and the ground selection lines GSL.

In the conventional configurations described previously, the ground selection line and the string selection line are maintained at a ground voltage in the standby state. Thus, as described previously, upon initiation of a read operation, both the ground selection line and the string selection line are driven to the read voltage at the same time. The resultant coupling noise can adversely influence the voltage of a word line interposed therebetween.

In contrast, according to the present embodiment, the ground selection lines GSL are pre-charged to a given voltage during the standby state. Preferably, but not necessarily, the given voltage is the read voltage. In the present embodiment, the pre-charging of the ground selection lines is realized by applying the second voltage in the standby state to the common voltage line which carries the ground selection voltage GS. Since the common voltage line is directly electrically connected to the ground selection lines GSL, the ground selection lines GSL are pre-charged to the given voltage in the standby state. This is true even though the block selection transistors BS0 and BS1 may be in an off state in the standby mode.

Since the second selection line GSL has already been pre-charged to the read voltage in the standby state, the word line WL is not as greatly influenced by coupling noise upon initiation of a read operation. For example, coupling noise resulting from the embodiment of the present invention may be less than half that of conventional configurations.

In the read operation, the block selection signal BS of the selected block is driven to high (e.g., VPP), which turns on the block selection transistors BS1 and BS0 of the selected memory block. As such, a string selection voltage of VREAD is applied to the string selection line SSL of the selected block, and a word line voltage Si of, for example, 0V is applied to the word line of the selected block.

The block selection signal BS of the non-selected block remains low (e.g., 0V), and the block selection transistors BS1 and BS0 of the non-selected block remain off. Although the ground selection voltage GS is applied to the ground selection line GSL of the non-selected blocks, the string selection transistors SST of the non-selected blocks remain off.

Since the voltage controller 330 applies the ground selection voltage GS directly to the second selection lines GSL, the second selection lines GSL need not be metal-strapped, thereby reducing the area of the nonvolatile memory device. That is, when the nonvolatile memory device is embodied as a chip, it is possible to reduce the chip size.

Figure 4:
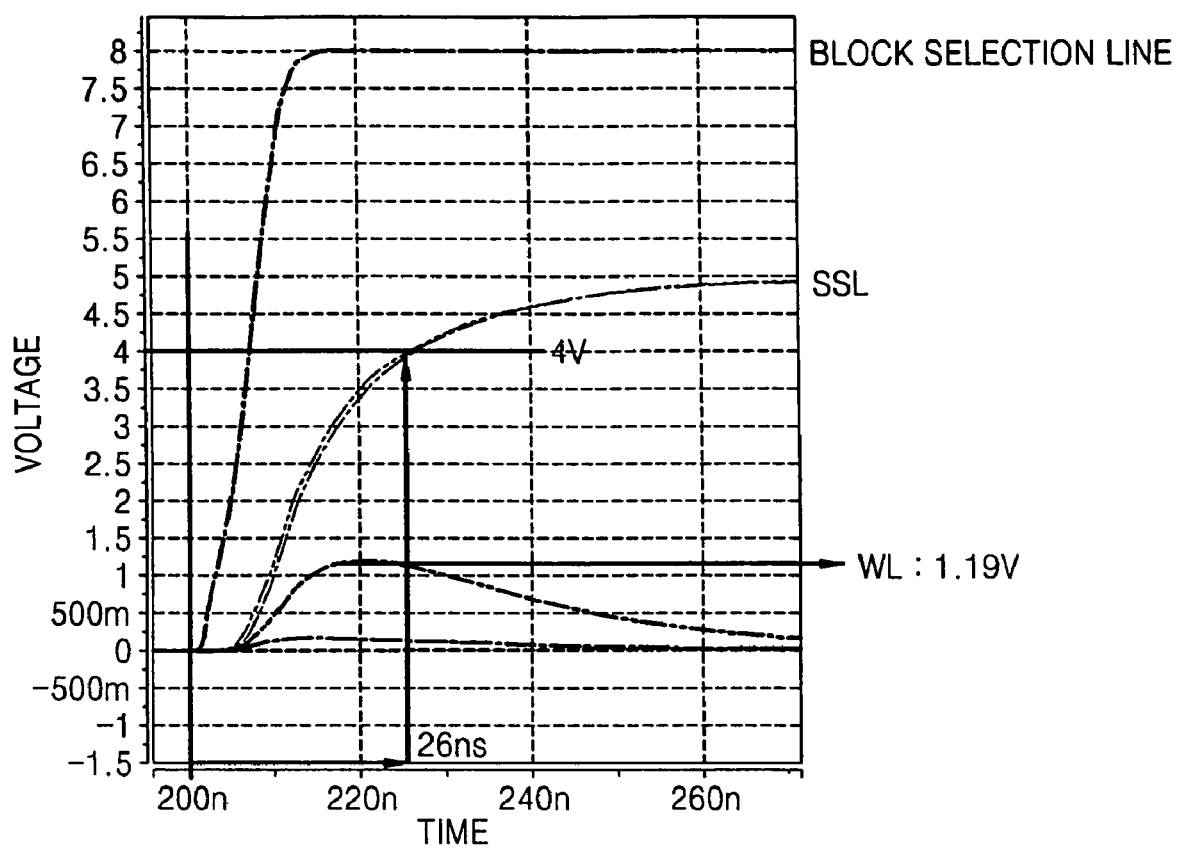
FIG. 4 is a graph illustrating simulation results of coupling noise during a read operation of a conventional nonvolatile memory device.
Figure 5:
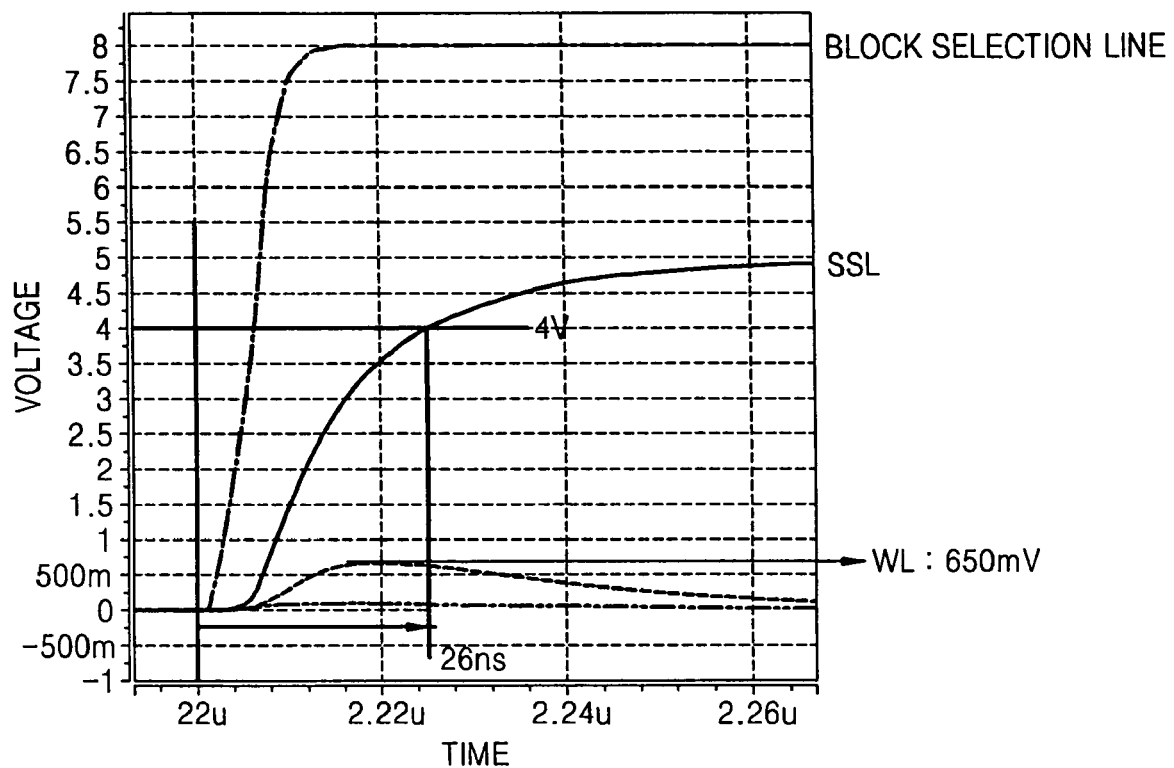
FIG. 5 is a graph illustrating simulation results of coupling noise during a read operation of a nonvolatile memory device according to an embodiment of the present invention.

FIG. 4 is a graph illustrating a simulation result of coupling noise during a read operation of a conventional nonvolatile memory device. FIG. 5 is a graph illustrating a simulation result of coupling noise during a read operation of a nonvolatile memory device according to an embodiment of the present invention.

Referring to FIG. 4, in the a simulation, when a read command was given in a standby state, a block selection line was activated, and then, the voltages of a first selection line SSL and a second selection line GSL were increased to a read voltage. In this case, noise of 1.19 V was generated in a word line WL. The noise resulted since the word line WL was affected by coupling noise generated from the increase in the voltages of the first selection line SSL and the second selection line GSL.

On the other hand, referring to FIG. 5, when the read command was given in the standby state, a block selection line was activated, and then, only a first selection line SSL was increased to the read voltage since a second selection line GSL was already precharged to the read voltage in the standby state. In this case, noise of 650 mV was generated in a word line WL. The significant reduction in noise is attributed to embodiment of the invention in which only the first selection line SSL is increased in voltage upon initiation of the read operation.

While this invention has been particularly shown and described with reference to exemplary embodiments thereof, it will be understood by those skilled in the art that various changes in form and details may be made therein without departing from the spirit and scope of the invention as defined by the appended claims.

What is claimed is:

1. A nonvolatile memory device comprising:
a memory cell array comprising a plurality of memory blocks, each memory block including a plurality of cell strings, where each of the cell strings includes a first selection transistor, a second selection transistor, and at least one memory cell transistor connected in series between the first and second selection transistors; and
a voltage controller which applies a first selection voltage to first selection lines connected to the first selection transistors, a second selection voltage to second selection lines connected to the second selection transistors, and a word line voltage to word lines connected to the memory cell transistors, in response to a plurality of block selection signals corresponding to the memory blocks,
wherein the voltage controller precharges the second selection lines to the second selection voltage, regardless of a state of the block selection signals, in a standby state.

2. The nonvolatile memory device of claim 1, wherein the second selection voltage is a read voltage.

3. The nonvolatile memory device of claim 1, further comprising:
a row selecting circuit for providing the voltage controller with the block selection signals for selecting a memory block from among the plurality of memory blocks.

4. The nonvolatile memory device of claim 1, wherein a block selection signal of a selected memory block is a high voltage, and wherein a block selection signal of a non-selected memory block is a low voltage.

5. A nonvolatile memory device, comprising:
a memory cell array comprising a plurality of memory blocks, each memory block including a plurality of cell strings, each of the cell strings including a first selection transistor, a second selection transistor, and at least one memory cell transistor connected in series between the first and second selection transistors; and
a voltage controller configured to apply a first selection line voltage to first selection lines connected to the first selection transistors and a word line voltage to word lines connected to the memory cell transistors, in response to a plurality of block selection signals, and to apply a second selection line voltage directly to second selection lines connected to the second selection transistors,
wherein the voltage controller precharges the second selection lines to a precharge voltage by applying the second selection line voltage to the second selection lines in a standby state, where the second selection line voltage is equal to the precharge voltage.

6. The nonvolatile memory device of claim 1, wherein the first selection line is a string selection line, and the second selection line is a ground selection line.

7. The nonvolatile memory device of claim 1, wherein the memory device is configured in an executed-in-place structure.

8. A reading method of a nonvolatile memory device comprising a plurality of memory blocks, each memory block having a block selection signal and a plurality of cell strings, where each of the cell strings includes a first selection transistor, a second selection transistor, and at least one memory cell transistor connected in series between the first and second selection transistors, the method comprising:
- precharging a second selection line, which is connected to the second selection transistor, to a precharge voltage in a standby state, the second selection line being precharged to the precharge voltage regardless of a state of the block selection signal; and
- performing a read operation on a memory block selected from the plurality of memory blocks, in response to a read command and an address command.

9. The method of claim 8, wherein the precharge voltage is a read voltage.

10. The method of claim 8, wherein the performing of the read operation comprises:
- providing block selection signals for selecting the memory block from the plurality of memory blocks, on which the read operation is to be performed, in response to the address command;
- applying a read voltage to a first selection line connected to a first selection transistor of the selected memory block, and non-selected world lines of word lines connected to memory cell transistors of the selected block, and a ground voltage to a selected word line of the word lines; and
- reading data from a memory cell transistor corresponding to the selected word line.

11. The method of claim 10, wherein a block selection signal, which corresponds to the memory block on which the read operation is performed, has a first selection voltage, and wherein remaining block selection signals, which correspond to the memory blocks on which the read operation is not performed, have a second selection voltage.

12. A method of reading a nonvolatile memory device comprising a plurality of memory blocks, each memory block having a plurality of cell strings, where each cell string includes a first selection transistor, a second selection transistor, and at least one memory cell transistor connected in series between the first and second selection transistors, the method comprising:
- precharging a second selection line, connected to the second selection transistor, to a precharge voltage; and
- performing a read operation on a memory block, selected from the plurality of memory blocks, in response to a read command, an address command and a block selection signal, wherein performing the read operation comprises:
  - applying a read voltage to a first selection line connected to a first selection transistor of the selected memory block, and a ground voltage to a selected word line of the selected memory block; and
  - reading data from a memory cell transistor corresponding to the selected word line,
- wherein the read and ground voltages are respectively applied to the first selection line and the word line in response to the block selection signal, and wherein the precharge voltage is applied directly to the second selection line.

13. The method of claim 8, wherein the first selection line is a string selection line, and the second selection line is a ground selection line.

14. The method of claim 8, wherein the nonvolatile memory device is configured in an executed-in-place structure.

15. The nonvolatile memory device of claim 1, wherein the voltage controller maintains the first selection lines at an initial voltage, less than each of the first and second selection voltages, in the standby state.

16. The nonvolatile memory device of claim 5, wherein the precharge voltage comprises a read voltage.

17. The nonvolatile memory device of claim 16, wherein the second selection lines maintain the read voltage during a read operation.

18. The nonvolatile memory device of claim 5, further comprising:
- a row selector for providing the voltage controller with the block selection signals for selecting a memory block from the plurality of memory blocks.

19. The nonvolatile memory device of claim 5, wherein the first selection line is a string selection line, and the second selection line is a ground selection line.

20. The nonvolatile memory device of claim 5, wherein the memory device comprises an executed-in-place structure.

* * * * *